United States Patent [19]

Levinos

[11] 3,909,273

[45] Sept. 30, 1975

[54] PHOTOPOLYMERIZATION UTILIZING DIAZOSULFONATE AND AROMATIC HYDROXY COMPOUNDS

[75] Inventor: Steven Levinos, Summit, N.J.

[73] Assignee: Keuffel & Esser Company, Morristown, N.J.

[22] Filed: July 23, 1973

[21] Appl. No.: 381,452

[52] U.S. Cl. ................ 96/115 P; 96/35.1; 96/84 R; 96/85; 96/87 R; 96/86 P; 96/67; 96/91 R; 204/159.23

[51] Int. Cl.[2] ........................................... G03C 1/70

[58] Field of Search ......................... 96/115 P, 35.1; 204/159.23

[56] References Cited

UNITED STATES PATENTS

| | | | |
|---|---|---|---|
| 2,996,381 | 8/1961 | Oster et al. | 96/115 P |
| 3,620,734 | 11/1971 | Cerwonka | 96/35.1 |
| 3,637,375 | 1/1972 | Levinos | 96/35.1 |

*Primary Examiner*—Ronald H. Smith
*Attorney, Agent, or Firm*—Lionel N. White, Esq.

[57] ABSTRACT

A photo-sensitive initiator for polymerization of ethylenically unsaturated compounds is the combination of a diazo-N-sulfonate and an aromatic hydroxy compound.

8 Claims, No Drawings

PHOTOPOLYMERIZATION UTILIZING DIAZOSULFONATE AND AROMATIC HYDROXY COMPOUNDS

BACKGROUND

Polymerization of vinyl monomers has been initiated through the use of the oxidation-reduction reaction ensuing from a combination of a diazonium salt electron acceptor and a hydroquinone electron doner. Such a process for the polymerization of ethylenically unsaturated compounds has been described, for example, in U.S. Pat. No. 3,099,558. In view of the fact, however, that the polymerization reaction proceeds spontaneously upon combination of the electron doner/acceptor components of the system, such materials cannot practically be employed in premixed compositions. Thus, the use of such polymerization initiators in compositions destined for use, for example, in coated photoimaging materials, is not feasible.

SUMMARY

In accordance with the present invention, a latent polymerization initiator is provided which can be mixed with polymerizable ethylenically unsaturated monomers to yield compositions which will remain inactive for extended periods of time until exposed to light. Such an initiator comprises the combination of a diazo-N-sulfonate and an aromatic hydroxy compound, such as the hydroxy-benzene-derived compounds employed extensively as reducing developers for silver halide photographic compositions.

The diazo-N-sulfonate component of the light-sensitive polymerization initiator can be any of numerous such compounds which may be readily prepared from diazotized amino benzene compounds through the use of alkali metal sulfites. Such diazosulfonate compounds exhibit excellent dark stability even in the presence of other components of polymerizable compositions.

Thus, the mixture of a diazosulfonate compound and an aromatic hydroxy compound, such as hydroquinone, has little effect in initiating polymerization of an ethylenically unsaturated compound, yet upon exposure to actinic radiation, such as ultraviolet light, the diazosulfonate readily dissociates to yield a diazonium cation which, in combination with the aromatic hydroxy compound, effects a redox reaction which generates polymerization-initiating free radical species.

The diazosulfonate may be readily combined with the aromatic hydroxy component and a polymerizable ethylenically unsaturated compound in a fluid solution or dispersion to yield a composition capable of mass polymerization upon exposure to light. In another practical use, the photo-sensitive polymerization-initiating combination may be included in a layer coated on a suitable support, such as paper, film, glass, or metal. The coated layer additionally comprises the polymerizable compound, a film-forming binder, and such other addenda, e.g., dyes or coloring pigments, as may be desired. Imagewise exposure to light of such coated layers effects a corresponding imagewise polymerization of the coated composition. The resulting polymeric images may be readily "developed" by removal or transfer of lesser exposed, unpolymerized composition by the use of suitable solvent or thermal means in the well-known manner. Alternatively, the imagewise disposition of polymeric material may be given more visual distinction by the direct application of pigmenting or coloring compositions.

DESCRIPTION

Any normally liquid or solid polymerizable unsaturated organic compound may be employed in the present invention. Preferably, such compounds comprise ethylenically unsaturated materials, i.e., those containing at least one non-aromatic double bond between adjacent carbon atoms. Particularly useful materials include vinyl or vinylidene compounds, such as acrylamide, diacetone acrylamide, N-methylolacrylamide, N-isopropyl acrylamide, acrylonitrile, N-vinyl carbazole, hydroxyethyl methacrylate, barium acrylate, magnesium acrylate, itaconic acid esters, monoethanolamine acrylate, and sodium or ammonium acrylates.

Such polymerizable compounds may be used alone or in admixture in order to vary physical properties, such as hardness or solubility, in the final polymer. Further, cross-linking agents, such as N,N'-methylenebisacrylamide, triallyl cyanurate, divinyl benzene, divinyl ketones, and diglycol diacrylate, and other difunctional monomers, such as calcium, barium, zinc, and magnesium acrylates may be added in various proportions, for example, in the range from about 2 to 10 parts per 100 parts of monomer, to increase the strengthened hardness of the resulting polymer.

As previously noted, the diazo-N-sulfonate component may be readily prepared by the addition of the alkali sulfite to a benzene diazonium compound of electron acceptor character. Numerous such diazonium compounds are available through common diazotization of amino benzene compounds, such as anisidine, toluidine, dialkoxy-amino-benzene, dialkoxy-p-phenylene-diamine, and p-mercapto-dialkoxy-amino-benzene. The rate of polymerization generally increases with the amount of diazo-N-sulfonate included in the composition, and there has been found that an effective ratio of components in the noted fluid compositions is about one part of diazosulfonate to about 50 to 100 parts of monomer on a dry weight basis. When employed in coated layers, an effective ratio of diazosulfonate to monomer and binder is in the range of about 2 to 4 parts for each 15 parts of the monomer mixture.

The aromatic hydroxy component of the light-sensitive polymerization initiator may comprise one or more of many available photographic developers, such as hydroquinone, pyrogallol, p-amino phenol, chloro hydroquinone, p-methyl-amino phenol, and the like. This component is particularly effective when combined with the diazo-N-sulfonate in a ratio of about one part per 1 to 2 parts of diazosulfonate. This suggested ratio may, of course, be varied to a considerable extent; however, the indicated range appears to be most practical.

It may be well to note that a particular advantage obtains in the use of mixtures of the aromatic hydroxy compounds, since some of these components, pyrogallol, for example, exhibit a tendency to absorb vagrant oxygen which, if present in the composition, would otherwise inhibit the onset of polymerization to a considerable extent. Such oxygen scavengers thus effectively increase the photo-sensitivity of the polymerizable compositions.

Fluid polymerizable compositions are preferably aqueous in nature, since the presence of water is particularly conducive to rapid polymer formations. Most other fluid systems may be readily formulated, however, to include effective amounts of water; for example, quantities of water up to about 5% may be incorporated even in essentially organic solvent systems without difficulty when humectants or dispersing agents are utilized.

When employing the photo-sensitive initiator combination in coated layers for the purpose of preparing photo-imaging materials, it is preferable to include a film-forming binder component in order to maintain the physical integrity of the coated mass and to retain the composition on the surface of the carrier. In view of the fact that the polymerization reaction proceeds most effectively in the presence of water, it is preferred to employ as binder materials such hydrophilic colloids as gelatin, casein, glue, saponified cellulose acetate, carboxymethyl cellulose, starch, polyvinyl pyrrolidone, and the like, and to include in the composition humectants, such as glycerin, ethylene glycol, and trimethylolpropane. Gelatin in particular provides a useful binding medium, since it serves as a base for the formation of graft polymer and further participates in the formation of hardened images as a result of its being tanned by the quinone-type oxidation products of the aromatic hydroxy component taking part in the redox reaction at the site of light exposure.

Incorporation of greater amounts of humectants may enable the use of less hydrophilic binders while retaining a desirable amount of moisture in the composition. The hydrophilic nature of the preferred binder components, however, further serves to enable ready removal of unpolymerized areas of a coating by simple water washing in order to effect the formation of resist or relief images.

Since it is often desirable to impart various hues and colors to ultimate images, dyes or pigments may readily be incorporated into the coating compositions of the present invention. It should be noted, however, that such pre-dyed or pre-pigmented coatings are likely to require longer exposure to light in order to effect polymerization, since incorporated dyes and pigments commonly absorb some portion of the incident radiation. It may thus be a preferable alternative to effect image formation with slightly colored polymerizable compositions and to subsequently apply dye solutions which are specific to the polymer image or the underlying background areas made available as a result of removal of unexposed, unpolymerized coated material.

PREFERRED EMBODIMENTS

The following Examples 1–10 demonstrate the general utility of the present invention as a means of polymerizing a mass of ethylenically unsaturated compound in a fluid medium.

EXAMPLE 1

A master solution of polymerizable monomer and cross-linking agent was prepared of the following composition:

| | |
|---|---|
| Deionized water | 60. ml. |
| Acrylamide | 90. gm. |
| N,N'-methylenebisacrylamide | 5. gm. |

To a 5 ml. portion of the master solution was added, with dissolution, 50 mgm. of hydroquinone and the resulting solution was saturated with about 100 mgm. of the diazosulfonate of 4-chloro-3-amino-1-anisole. The resulting composition was exposed for 30 seconds in a 13 × 100 mm. test tube to the light of a 500 watt G.E. Photoflood lamp positioned at a distance of about 15 cm. Subsequent to the light exposure there was observed a mass of white polymer precipitate in the tube. A second 5 ml. portion of the master solution was saturated with about 100 mgm. of the diazosulfonate and exposed under similar conditions for a period of 60 seconds without the formation of polymeric precipitate.

EXAMPLES 2–10

Each of the following amines was used to prepare the corresponding diazo-N-sulfonate which was combined with hydroquinone in the manner described in Example 1 to form the respective photopolymerization initiator in a 5 ml. portion of master solution.

2. p-anisidine
3. 5-chloro-o-anisidine
4. 1-amino-2,5-dimethoxy-4-p-tolylmercapto-benzene
5. 1-amino-2,5-diethoxy-4-p-tolylmercapto-benzene
6. p-toluidine
7. 1-amino-2,5-dimethoxy-benzene
8. 3-amino-1,4-diethoxy-benzene
9. 1-amino-2,5-diethoxy-4-benzoyl amino-benzene
10. 4-amino-6-chloro-1,3-dimethoxy-benzene Upon exposure for 30 seconds as described in Example 1, each of the sample solutions yielded a polymeric precipitate. Similarly, sample solutions devoid of the aromatic hydroxy component provided no polymer formation even after an exposure of 60 seconds.

EXAMPLE 11

A coated layer of polymerizable composition was prepared in the following manner:

Part A

| | | |
|---|---|---|
| Deionized water | 100. | ml. |
| Gelatin (inert, high bloom) | 5. | gm. |
| Polyvinyl pyrrolidone (med. visc.) | 1.5 | gm. |
| Chlorohydroquinone | 1.25 | gm. |
| Denatured ethanol | 20. | ml. |
| Deionized water | 20. | ml. |

The gelatin and polyvinyl pyrrolidone was dissolved in the 100 ml. deionized water, followed by the addition of the chlorohydroquinone with stirring. This was followed by the addition of denatured ethanol admixed with deionized water in the quantities indicated. The pH of this mixture measured 5.8.

Part B

| | | |
|---|---|---|
| Deionized water | 120. | ml. |
| Gelatin (inert, high bloom) | 4. | gm. |
| p-anisidine diazosulfonate | 2.5 | gm. |
| Acrylamide | 4.2 | gm. |
| N,N'-methylenebisacrylamide | 0.8 | gm. |
| Sodium dodecyl-benzene sulfonate (20% sol.) | 5. | ml. |

Each of the ingredients was dissolved, with stirring, in the deionized water in the order given. The pH of this mixture was 6.7. Part B was then rapidly added to Part A with stirring. The final pH of this composite mix was 6.2.

The composition was coated at the rate of about 4 cm. per second on a miniscus coater onto a pre-subbed polyester film support commonly used in the preparation of photographic materials. The coated film was allowed to air-dry in darkness at about 25°C. A section of the resulting coated film was exposed through a master stencil for 20 seconds to the light of a 300 watt Photoflood lamp positioned at a distance of about 12 cm. Subsequent to exposure, the coated material was washed with water at a temperature of about 25°C with resulting removal of unexposed areas of the coated layer. The sheet was then immersed in an aqueous solution of methylene blue and rinsed with water to yield a positive blue image of the negative stencil.

EXAMPLE 12

A pigmented imaging material was prepared by including in the coating composition a diazonium compound and an azo dye coupler in order to form in situ an azo dye coloring pigment for the final coated composition. It should be noted that the relative proportions of these dye-forming materials were substantially stoichiometric and, therefore, no excess diazonium compound was present in the composition when the polymeric monomers were added.

The coating composition was prepared as follows:

Part A

| | |
|---|---|
| Deionized water | 50. ml. |
| Gelatin (inert high bloom) | 5. gm. |
| Polyvinyl pyrrolidone (med. visc.) | 1.5 gm. |
| 4-(p-tolylmercapto)-2,5-dimethoxy diazonium chloride | 1.75 gm. |
| Phloroglucinol | 0.7 gm. |
| Chlorohydroquinone | 1.25 gm. |

The gelatin and polyvinyl pyrrolidone were first dissolved in the deionized water. The diazonium salt was then added with stirring to effect its complete dissolution. This was followed by the dropwise addition of the phloroglucinol which was dissolved in 40 ml. of 1:1 mixture of denatured ethanol and water. The addition was made over a period of about 15 minutes. A black pigment formed as a result of the coupling reaction. The chlorohydroquinone was then added with stirring to facilitate its solution. The pH of this mixture was 3.7.

Part B

| | |
|---|---|
| Deionized water | 20. ml. |
| Gelatin (inert, high 4. | 4 gm. |
| p-anisidine diazosulfonate | 2.5 gm. |
| Acrylamide | 4.2 gm. |
| N,N'-methylenebisacrylamide | 0.8 gm. |
| Sodium dodecyl benzene sulfonate (20% sol.) | 5. ml. |

Each of the ingredients was dissolved in the deionized water in the order given, with stirring to effect dissolution of the solid components. The pH of this mixture measured 6.9.

Part B was added rapidly, with stirring, to Part A. The pH of this composite mixture was 4.4. The addition of 0.3 gm. sodium sulfite raised the pH of the final mixture to 5.0. The composition was then coated onto a subbed, matte-surface polyester film support and dried in the manner described in Example 11.

Separate sections of the coated material were exposed in the manner of Example 11 for different lengths of time and were subsequently washed with water at a temperature of about 25°C. Discernible images of the stencil master were formed after about 5 seconds exposure with excellent images resulting from about 30 seconds exposure.

What is claimed is:

1. A polymerizable composition comprising:

a. an ethylenically unsaturated vinyl compound; and b. a photo-sensitive polymerization initiator comprising a combination of:

1. a light-sensitive aromatic diazo-N-sulfonate, and
2. an aromatic hydroxy compound.

2. The composition of claim 1 wherein said diazo-N-sulfonate is derived from a benzene diazonium compound of electron acceptor character.

3. A composition according to claim 1 wherein said vinyl compound and said initiator are intimately admixed in a fluid medium.

4. The composition according to claim 3 wherein said diazo-N-sulfonate is present in an amount of one dry weight part per 50 to 100 parts of said vinyl compound.

5. A composition according to claim 3 comprising at least about 5 weight percent water.

6. A composition according to claim 1 wherein said aromatic hydroxy compound is present in an amount of one dry weight part per 1 to 2 parts of said diazo-N-sulfonate.

7. Photo-imaging material comprising:

a. a support; and b. coating on said support of a photopolymerizable composition according to claim 1.

8. Photo-imaging material according to claim 7 wherein said composition includes a water-dispersible binder.

* * * * *

UNITED STATES PATENT OFFICE
CERTIFICATE OF CORRECTION

PATENT NO. : 3,909,273

DATED : 30 September 1975

INVENTOR(S) : Steven Levinos

It is certified that error appears in the above-identified patent and that said Letters Patent are hereby corrected as shown below:

Column 5, line 30, should read: -- Deionized water 150 ml. --

Column 5, line 53, should read: -- Deionized water 120 ml. --

Column 6, line 1, should read: --Gelatin (inert,high bloom) 4 gm. --

Signed and Sealed this

*sixth* Day of *January 1976*

[SEAL]

*Attest:*

RUTH C. MASON
*Attesting Officer*

C. MARSHALL DANN
*Commissioner of Patents and Trademarks*